Feb. 2, 1965 D. S. COCHRAN 3,168,702
VOLTAGE COMPARATOR
Filed July 30, 1962
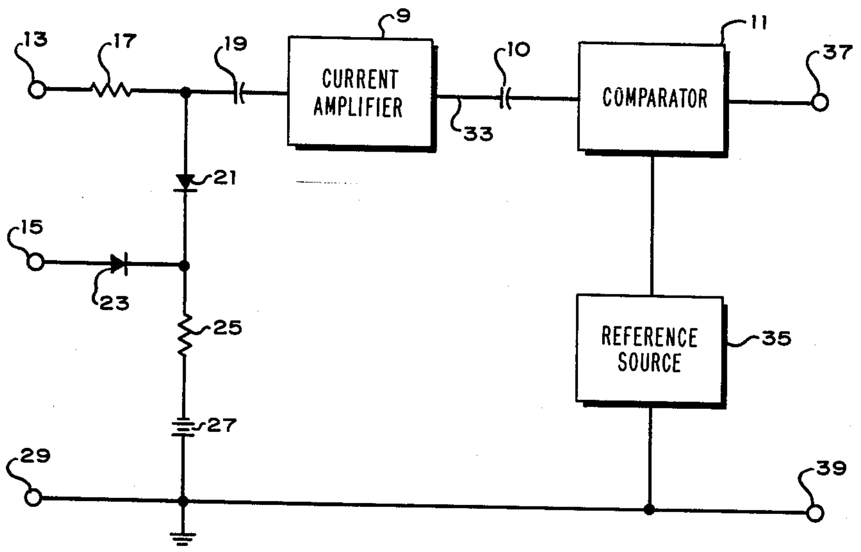
INVENTOR
DAVID S. COCHRAN
BY J. C. Chapman
ATTORNEY United States Patent Office 3,168,702
Patented Feb. 2, 1965

3,168,702
VOLTAGE COMPARATOR

David S. Cochran, Palo Alto, Calif., assignor to Hewlett-Packard Company, Palo Alto, Calif., a corporation of California Filed July 30, 1962, Ser. No. 213,271
1 Claim. (Cl. 328—150)

This invention relates to a circuit for accurately detecting when two signals are equal or bear a predetermined relationship to each other.

Multiar circuits are commonly used to produce an output signal when a variable signal and a reference signal, say ground, are of equal amplitude. One disadvantage of these circuits is that the accuracy with which the signal comparison can be made is limited by the random noise signals which are present about the zero crossing. It is desirable to reduce the effects of these random noise signals. One way to do so is to compare the applied signals at high signal levels. Random noise signals would thus represent a smaller proportion of the signals which are compared and the effects of the random noise upon the comparison accuracy would therefore be greatly reduced.

Accordingly, it is an object of the present invention to provide a voltage comparator which minimizes the effects of random noise signals upon the accuracy with which signal comparison is made.

It is another object of the present invention to provide an improved voltage comparator.

Other and incidental objects of the present invention will be apparent from a reading of this specification and an inspection of the accompanying drawing which shows a schematic diagram of the circuit of the present invention.

The drawing shows a comparator 11 connected through capacitor 10 to the output of current amplifier 9. A pair of input terminals 13 and 15 are provided for receiving the signals to be compared. Input terminal 13 is connected to the input of amplifier 9 through serially connected resistor 17 and capacitor 19. A pair of diodes 21 and 23 is serially connected in conduction opposition between the common connection 31 of resistor 17 and capacitor 19 and the input terminal 15. A current source including resistor 25 and voltage source 27 is connected between ground or reference potential and the common connection of the diodes.

In one application of the present invention a ramp generator is connected between the ground terminal 29 and input terminal 15. The voltage to be compared with the ramp voltage at terminal 15 is applied to input terminal 13. A negative-going ramp voltage applied at input terminal 15 renders diode 23 conductive. The current flowing through diode 23 is determined substantially by the value of voltage source 27 and resistor 25. The steady voltage applied at terminal 13 is usually less than the initial value of the ramp voltage appearing at terminal 15 and thus diode 21 is rendered non-conductive. As the ramp voltage appearing on terminal 15 decreases substantially to the value of the applied voltage at terminal 13, diode 21 becomes slightly conductive and the current from the current source including resistor 25 and voltage supply 27 splits and flows partially in diode 23 and partially in diode 21. Since current amplifier 9 has substantially zero input impedance, the current in diode 21 flows in the input circuit of the amplifier from the charged capacitor 19. As the ramp voltage on input terminal 15 continues to decrease, a point is reached at which the current in diode 21 equals the current in diode 23. The diodes are selected to have matched conduction characteristics and thus the voltage drops across each of the diodes are equal. The voltage at junction 31 thus equals the voltage at input terminal 15. Negligible current flows in resistor 17 as long as the current through diode 21 continues to increase and continues to be supplied by capacitor 19 which is initially charged substantially to the value of the voltage at input terminal 13. At the moment when the current in diode 21 equals the current in diode 23 the voltages appearing at terminals 13 and 15 are equal. This current flowing in capacitor 19 and in the input of amplifier 9 is amplified and appears at the output 33 as a large voltage which is compared with a reference source 35 by comparator 11. The value of reference source 35 is chosen to equal the voltage which appears at output 33 when the current flowing in the input of amplifier 9 and in diode 21 equals the current flowing in diode 23. The comparison of the voltage at output 33 with the reference voltage from source 35 is made at a sufficiently high level by comparator 11 to minimize the effects upon comparison accuracy of random noise voltages. Thus a signal is produced at output terminals 37 and 39 at the instant when the currents in diodes 21 and 23 are equal and hence, at the instant when the voltage at input terminal 13 is equal to the voltage at input terminal 15.

In other applications of the present invention input terminal 13 is connected to ground and a ramp voltage or other time-varying signals is applied to input terminal 15. An output signal is produced at the terminals 37 and 39 substantially in a manner as previously described when the currents in diodes 21 and 23 are equal. This occurs when the voltage at terminal 15 decreases to zero volts.

Therefore the circuit of the present invention detects the equality of amplitude of two applied signals, at least one of which is a ramp voltage or other time-varying signal. This detection is accomplished by amplifying the change in conduction current in one of a pair of diodes to which the signal is applied. A comparison of the amplified signal with a high level reference signal reduces the effects of random noise signals upon the accuracy of the signal comparison.

I claim:

A circuit for comparing first and second signals, the circuit comprising a first input for receiving a first signal and a second input for receiving a second signal, a pair of diodes serially connected in conduction opposition, a current source connected to a point between said diodes, means connecting the first input to one of said diodes, means connecting the second input to the other of said diodes, a current amplifier, capacitive means connecting the input of said amplifier and said one of the diodes, a signal comparator connected to the output of said amplifier, and a source of reference signal connected to said comparator, said comparator producing an output signal when the signal applied thereto from said amplifier bears a predetermined relationship to said reference signal.

References Cited by the Examiner

UNITED STATES PATENTS

| | | | |
|---|---|---|---|
| 2,723,355 | 11/55 | Graham | 307—88.5 |
| 2,773,981 | 12/56 | Goodall | 328—150 |
| 3,005,918 | 10/61 | Judkins | 307—88.5 |
| 3,054,910 | 9/62 | Bothwell | 307—88.5 |

JOHN W. HUCKERT, *Primary Examiner.*

ARTHUR GAUSS, *Examiner.*